United States Patent
Ohta (10) Patent No.: US 8,027,755 B2
(45) Date of Patent: Sep. 27, 2011

(54) TRANSPORTATION VEHICLE SYSTEM AND METHOD FOR ASSIGNING TRAVEL PATH TO TRANSPORTATION VEHICLE

(75) Inventor: Hidekazu Ohta, Aichi (JP)

(73) Assignee: Murata Machinery, Ltd., Kyoto (JP)

( * ) Notice: Subject to any disclaimer, the term of this patent is extended or adjusted under 35 U.S.C. 154(b) by 0 days.

(21) Appl. No.: 12/622,941

(22) Filed: Nov. 20, 2009

(65) Prior Publication Data

US 2010/0138082 A1    Jun. 3, 2010

(30) Foreign Application Priority Data

Dec. 2, 2008   (JP) ................................. 2008-307482

(51) Int. Cl.
*G05D 3/00* (2006.01)

(52) U.S. Cl. ............ 701/2; 701/202; 701/208; 701/209; 701/210; 701/211; 340/955; 340/988; 340/990; 318/587; 180/2.1; 180/168; 191/6; 191/10; 191/18; 104/125; 104/288

(58) Field of Classification Search .................. 701/209, 701/117, 213, 24, 202, 208, 210, 211, 200, 701/201, 23, 118, 2; 340/995.19, 988, 990, 340/995.13; 318/587; 246/5; 191/6, 10, 191/18; 180/2.1, 168; 705/6; 104/125, 288
See application file for complete search history.

(56) References Cited

U.S. PATENT DOCUMENTS

| | | | | |
|---|---|---|---|---|
| 3,661,093 A | * | 5/1972 | Searle | 104/299 |
| 4,223,611 A | * | 9/1980 | Dawson et al. | 104/247 |
| 6,622,635 B2 | * | 9/2003 | Lund | 104/88.01 |
| 2006/0041345 A1 | * | 2/2006 | Metcalf | 701/33 |
| 2007/0233442 A1 | * | 10/2007 | Ito et al. | 703/13 |
| 2008/0147306 A1 | * | 6/2008 | Hayashi | 701/117 |
| 2008/0228389 A1 | | 9/2008 | Kano et al. | |
| 2009/0138186 A1 | * | 5/2009 | Ray | 701/117 |
| 2009/0309758 A1 | * | 12/2009 | Gueziec | 340/905 |
| 2010/0274513 A1 | * | 10/2010 | Matsuba | 702/89 |

FOREIGN PATENT DOCUMENTS

| | | |
|---|---|---|
| JP | 07-191723 A | 7/1995 |
| JP | 08-108774 A | 4/1996 |
| JP | 2000-153905 A | 6/2000 |
| JP | 2004-227060 A | 8/2004 |
| JP | 2005-339371 A | 12/2005 |
| JP | 2008-224547 A | 9/2008 |
| JP | 2008-234636 A | 10/2008 |

OTHER PUBLICATIONS

Japanese Office Action dated Oct. 26, 2010, issued in corresponding Japanese Patent Application No. 2008-307482.
Japanese Office Action dated May 24, 2011, issued in corresponding Japanese Patent Application No. 2008-307482.

* cited by examiner

*Primary Examiner* — James Trammell
*Assistant Examiner* — McDieunel Marc
(74) *Attorney, Agent, or Firm* — Westerman, Hattori, Daniels & Adrian, LLP (57) ABSTRACT

From among a plurality of interconnected segments of a travel route of a transportation vehicle, an operator manually assigns a plurality of segments that form a path for the transportation vehicle to actually travel, such assignment is received, a travel instruction is generated in accordance with the plurality of assigned segments, and the transportation vehicle is instructed to travel in accordance with the travel instruction.

5 Claims, 6 Drawing Sheets

| MOVE1 | MOVE2 | • • • | MOVEn |

TRANSPORTATION VEHICLE SYSTEM AND METHOD FOR ASSIGNING TRAVEL PATH TO TRANSPORTATION VEHICLE

BACKGROUND OF THE INVENTION

1. Field of the Invention

The present invention relates to a transportation vehicle system and, in particular, manual input performed by an operator to assign a travel path to a transportation vehicle.

2. Description of the Related Art

When a travel instruction is given, a transportation vehicle, such as an overhead traveling vehicle and an automated transportation vehicle or the like, autonomously selects a travel path. Such a transportation vehicle stores a map illustrating a travel route. On the map, the travel route is divided into a plurality of segments and, for example, a coordinate of segment boundaries and travel time required for each segment are illustrated. In such a coordinate, a difference between both ends of the segment defines a length of the segment. For example, two types of travel instructions are provided such as a transportation instruction given to assign a "from position" where an article is loaded and a "to position" where an article is unloaded and an instruction given to simply assign a position of a travel destination.

However, the environment for manually assigning the travel path to the transportation vehicle has not yet been developed. That is because, generally, the transportation vehicle has only to be assigned with the travel destination, and the travel path to the travel destination is not important. However, when a layout of the travel route is changed or the like, it is necessary to assign the travel path for testing, and then to instruct the transportation vehicle to travel. In such a case, in order to assign the travel path through an existing method, a plurality of instructions in which the travel destination is assigned need to be generated. Hereinafter, a path that is selected from the travel route for the transportation vehicle to actually travel will be referred to as a travel path.

Patent Document 1, "JP2000-153905A", discloses that a transportation vehicle is manually operated through the use of a remote controller. In a case where an overhead traveling vehicle is used, when executing such a manual operation, an operator needs to assign a speed and a divergent direction to the transportation vehicle while walking along the travel route, which thereby detracts efficiency.

SUMMARY OF THE INVENTION

One object of the present invention is to make the travel path of a transportation vehicle easily assigned manually.

According to one aspect of the present invention, a transportation vehicle system includes a plurality of automated transportation vehicles, a ground controller, and a travel route for the transportation vehicles to travel. The travel route includes a plurality of interconnected segments, and the transportation vehicles travel along selected segments of the travel route. The ground controller includes assigning means through which an operator manually assigns a plurality of segments that form a path for the transportation vehicle to actually travel, generating means for generating a travel instruction in accordance with the plurality of assigned segments, and execution means for instructing the transportation vehicle to travel in accordance with the travel instruction.

According to another aspect of the present invention, in a system that includes a plurality of automated transportation vehicles, a ground controller, and a travel route for the transportation vehicles to travel, the travel route including a plurality of interconnected segments, and the transportation vehicles arranged to travel along selected segments of the travel route, a travel path is assigned to the transportation vehicle. That is, from among the plurality of interconnected segments of the travel route for the transportation vehicle, an operator manually assigns, through assigning means of the ground controller, a plurality of segments that form a path for the transportation vehicle to actually travel, and such assignment is received. Then, a travel instruction is generated in accordance with the plurality of assigned segments by generating means of the ground controller, and the transportation vehicle is instructed to travel in accordance with the travel instruction by the assigning means of the ground controller.

Hereinafter, the description of the transportation vehicle system can be applied to the method for assigning the travel path to the transportation vehicle and vice versa.

According to the present invention, by assigning the segments, the travel path can be assigned, and the transportation vehicle can be instructed to travel. Accordingly, the operator does not need to walk along the travel path to guide the transportation vehicle. Moreover, the travel instruction can be easily generated compared with a case in which the travel path is assigned by generating a plurality of travel instructions each for a short distance. Accordingly, when newly installing the transportation vehicle system, when changing a layout of the transportation vehicle system, or when performing maintenance on a travel rail, or the like, by assigning the path and then instructing the transportation vehicle to travel, a status of the travel route can be easily inspected, or the like. Moreover, by acquiring required travel time by assigning the path and then instructing the transportation vehicle to travel, data of a route map can be updated. Further, when the transportation vehicle selects the travel path by having the previously-traveled path as a candidate, a new travel path can be taught. Thus, a situation where the transportation vehicle has selected an inefficient travel path can be handled.

Preferably, the assigning means includes a monitor arranged to display the travel route of the transportation vehicle, and input means provided for the operator to manually assign the plurality of segments. Thus, by assigning the segments on the monitor, the travel path can be easily assigned.

Further preferably, the monitor is a color monitor, and the assigning means displays, on the color monitor, the segments assigned by the operator in color that is different from that of the other segments. Thus, the already assigned portion of the travel path can be recognizably displayed, which thereby facilitates the operation of assigning the travel path and reduces the number of errors in the assignment.

Preferably, the travel route includes a diverging portion where one segment is connected with a plurality of segments and a junction portion where a plurality of segments are connected with one segment. Further, in the input means, when two segments among a plurality of segments connected without the diverging portion are assigned, a segment(s) arranged between the two selected segments is also assigned.

Further preferably, the transportation vehicle inspects the status of the travel route formed of the plurality of segments assigned in the travel instruction.

Further preferably, each of the transportation vehicles stores the route map on which the layout of the travel route and travel time required for each segment are illustrated, acquires the travel time for each segment assigned in the travel instruction, and updates the travel time required for the segments on the route map of each of the transportation vehicles.

DETAILED DESCRIPTION OF PREFERRED EMBODIMENTS

A preferred embodiment of the present invention will now be described. The embodiment of the present invention may be properly modified by referring to a well-known technique in the field, and does not limit a scope of the present invention.

Figure 1:
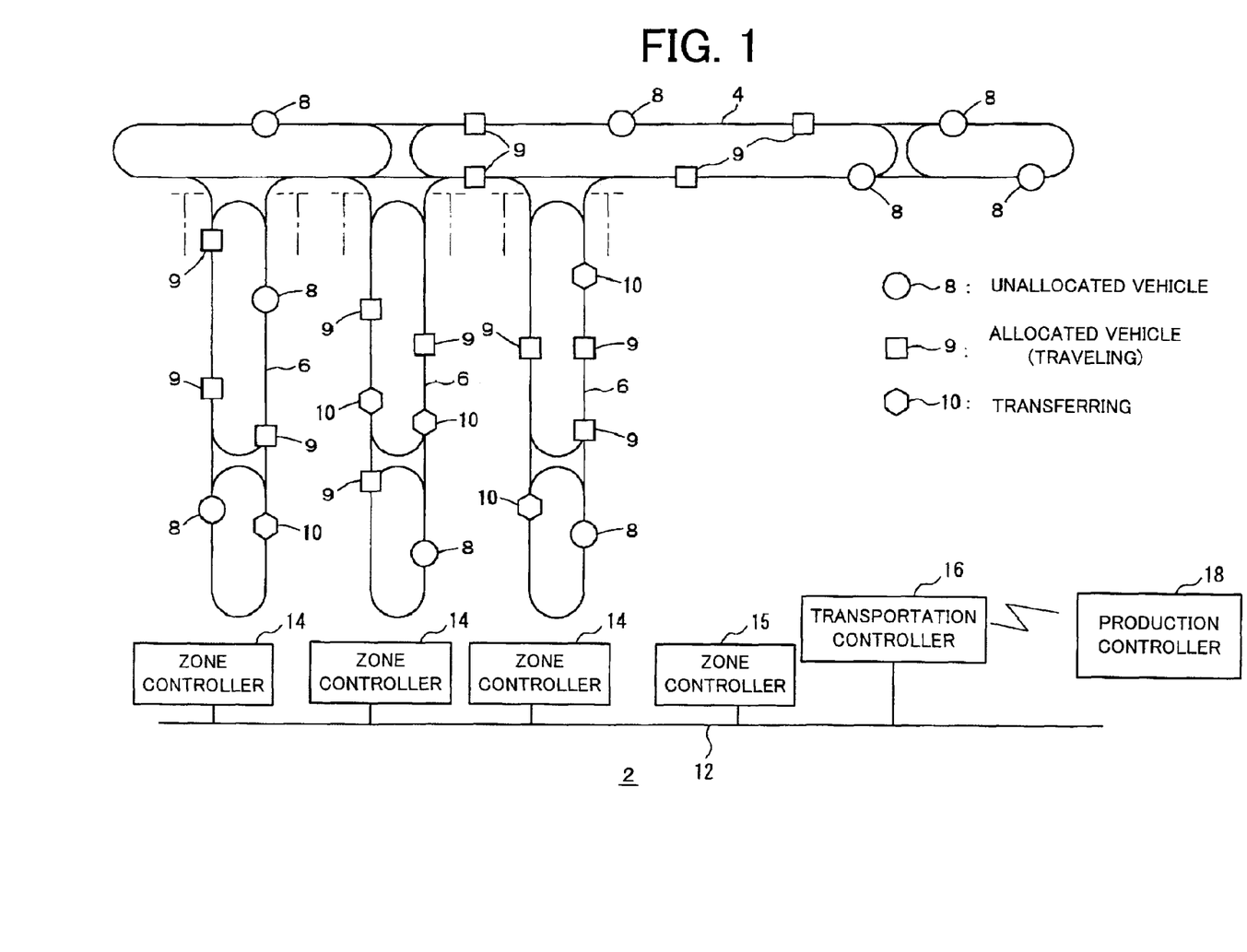
FIG. 1 illustrates a layout of a transportation vehicle system according to an embodiment of the present invention.

The embodiment of the present invention is illustrated in FIGS. 1 through 6. FIG. 1 illustrates a layout of a transportation vehicle system 2, and a plurality of intra-bay routes 6 are interconnected via an inter-bay route 4. In the layout of the transportation vehicle system 2, since there are a number of diverging points and shortcuts, even if a departure position and a destination position are assigned, there are still a great number of travel paths therebetween. Reference numerals 8 through 10 denote transportation vehicles and, more specifically, reference numeral 8 denotes a vehicle to which a transportation instruction has not been allocated, reference numeral 9 denotes a vehicle to which a transportation instruction has been allocated and which is presently traveling, and reference numeral 10 denotes a vehicle to which a transportation instruction has been allocated and which is presently transporting an article. Overhead traveling vehicles are used as the transportation vehicles 8 through 10, however, an automated (unguided) transportation vehicle or a track-guided vehicle that travels on the ground or the like may be used instead. For example, the transportation vehicle system 2 transports a semiconductor substrate or a flat panel display substrate etc. in a clean room or the like.

Reference numeral 12 denotes a bus, which connects ground controllers. For example, a zone controller 14 is provided as the ground controller in each of the intra-bay routes 6 so as to control the transportation vehicles 8 through 10 in the corresponding intra-bay route 6. A dot-dashed-line of FIG. 1 indicates a control range of one zone controller 14. The transportation vehicles 8 through 10 in the inter-bay route 4 are controlled by a zone controller 15, and the entire transportation vehicle system 2 is controlled by a transportation controller 16. Reference numeral 18 denotes a production controller, which communicates a transportation request to the transportation controller 16 and receives a transportation result from the transportation controller 16. The transportation controller 16 inputs various instructions to the transportation vehicles 8 through 10 and receives processing results regarding the instructions via the zone controllers 14 and 15.

Figure 2:
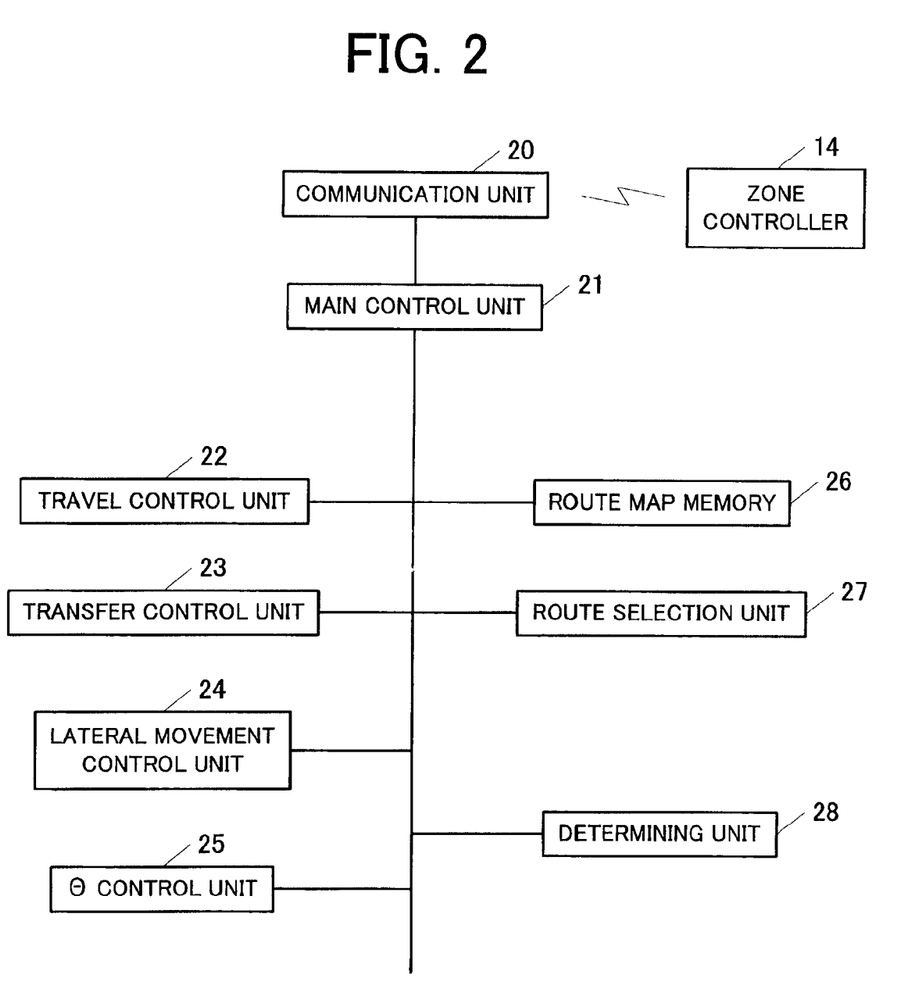
FIG. 2 is a block diagram illustrating a control system of a transportation vehicle according to an embodiment of the present invention.

FIG. 2 illustrates a control system of one transportation vehicle. A communication unit 20 communicates with the zone controllers 14 and 15. A main control unit 21 controls a travel control unit 22, a transfer control unit 23, a lateral movement control unit 24, a θ control unit 25, a route map memory 26, a route selection unit 27, and a determining unit 28 by interpreting the instructions received from the zone controllers 14 and 15, and reports execution results regarding the instructions to the zone controllers 14 and 15. The main control unit 21 also reports a current status of the transportation vehicle, such as a current position of the transportation vehicle, a traveling speed, an article-loaded state or an article being unloaded state during transfer, and an idling state in which a transportation instruction has not been allocated, or the like, and travel path inspection results to the zone controllers 14 and 15. The travel control unit 22 controls a travel motor. The transfer control unit 23 controls elevation movement of an elevation frame of the overhead traveling vehicle and chucking/release of the article. The lateral movement control unit 24 controls lateral movement of the elevation frame. The θ control unit 25 turns the elevation frame in a horizontal plane. The lateral movement control unit 24 and the θ control unit 25 may be omitted.

The route map memory 26 stores a route map of the travel path, and the interconnected segments are illustrated as the travel route on the map. With respect to each of the segments, a coordinate of an inlet port and an outlet port of the corresponding segment and required travel time for the corresponding segment are illustrated on the map. The coordinate is, for example, data that can be converted into a length of the corresponding segment. Unit of the segment may be arbitrarily selected, but an area that requires special control, such as, for example, a diverging portion and a junction portion, may be allocated as one segment, and an interval of a proper length in a straight interval may be allocated as one segment. For example, one segment may be provided with respect to each stop position, or a plurality of stop positions may be provided in one segment.

The route selection unit 27 refers to the route map so as to select a travel path from a current position to an assigned travel destination. In the selection of the travel path, the segments are practically selected, and by referring to the data of the route map, for example, a path that requires the shortest time from the current position to the travel destination is selected. The route selection unit 27 operates in response to an instruction given to assign only a travel destination and/or an instruction given to assign both a "from position" and a "to position". As in the present embodiment, when the travel path is specifically assigned in the instruction, the main control unit 21 interprets such instruction and controls the travel control unit 22.

The determining unit 28 includes a plurality of acceleration sensors and detects a degree of vibration imposed on the traveling transportation vehicle, or the like. Whether such vibration has occurred from factors on the transportation vehicle side or from factors on the travel rail side is not clear from the data of the sensors. The main control unit 21 outputs the degree of vibration occurring at each segment as determination results to the zone controllers 14 and 15, and then, the transportation controller 16 compares the determination results sent from the plurality of vehicles. Thus, for example, the travel route is determined with respect to each of the segments, and the status of each of the transportation vehicles is also determined.

Figure 3:
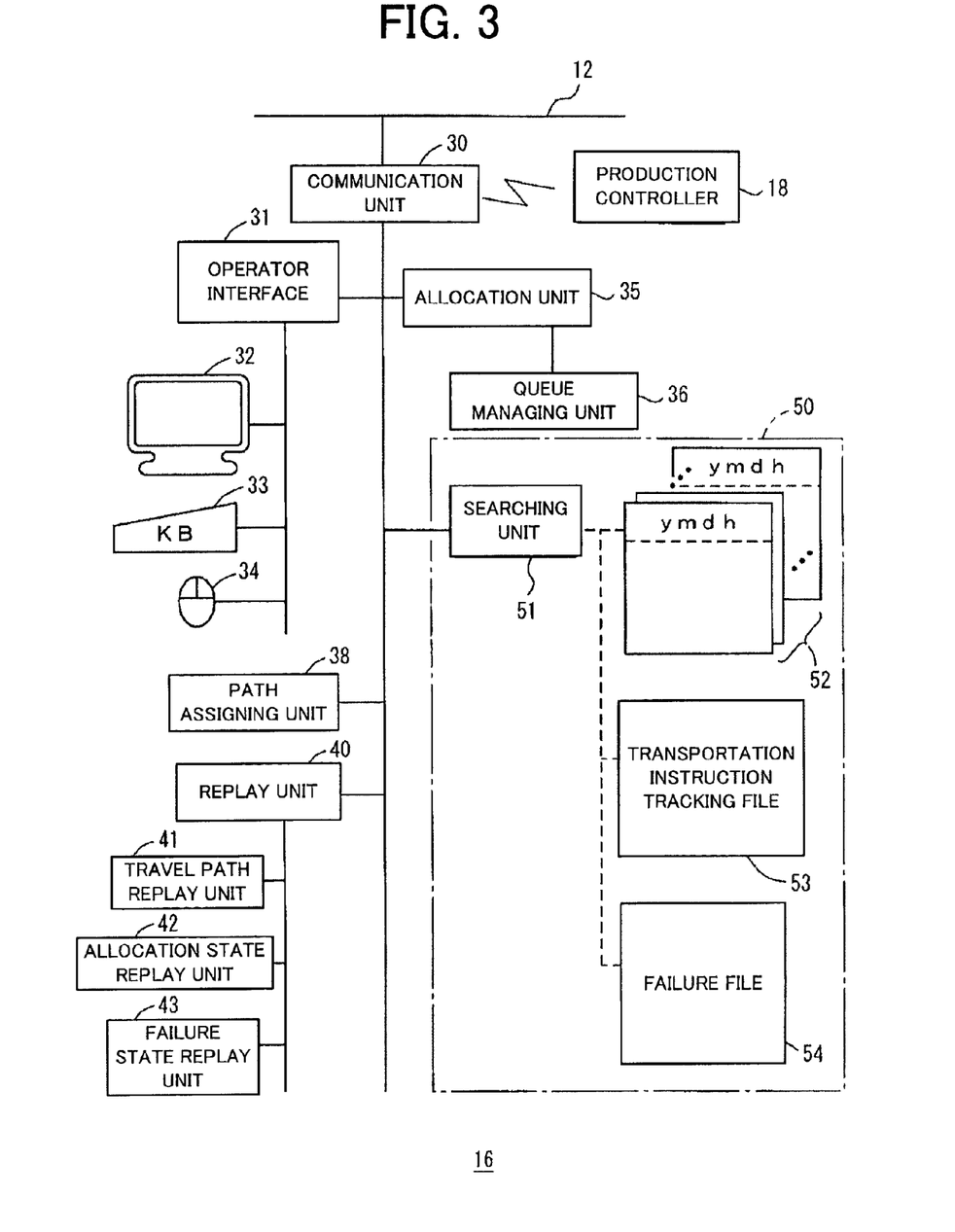
FIG. 3 is a block diagram of a transportation controller according to an embodiment of the present invention.

FIG. 3 illustrates a configuration of the transportation controller 16. A communication unit 30 communicates with the zone controllers 14 and 15 via the bus 12, and also communicates with the production controller 18 via a not-illustrated communication path. An operator interface 31 displays the travel route and operator's input on a color monitor 32, and receives manual input of the operator from manual input means such as a keyboard 33 and a mouse 34. In the present embodiment, the travel route is divided into the segments and displayed on the color monitor 32. The travel path assigned by the operator is displayed in color that is different from that of the other segments. An allocation unit 35 allocates the transportation instructions and travel instructions to the transportation vehicles. A queue managing unit 36 manages unallocated transportation instructions and travel instructions.

Figure 4:
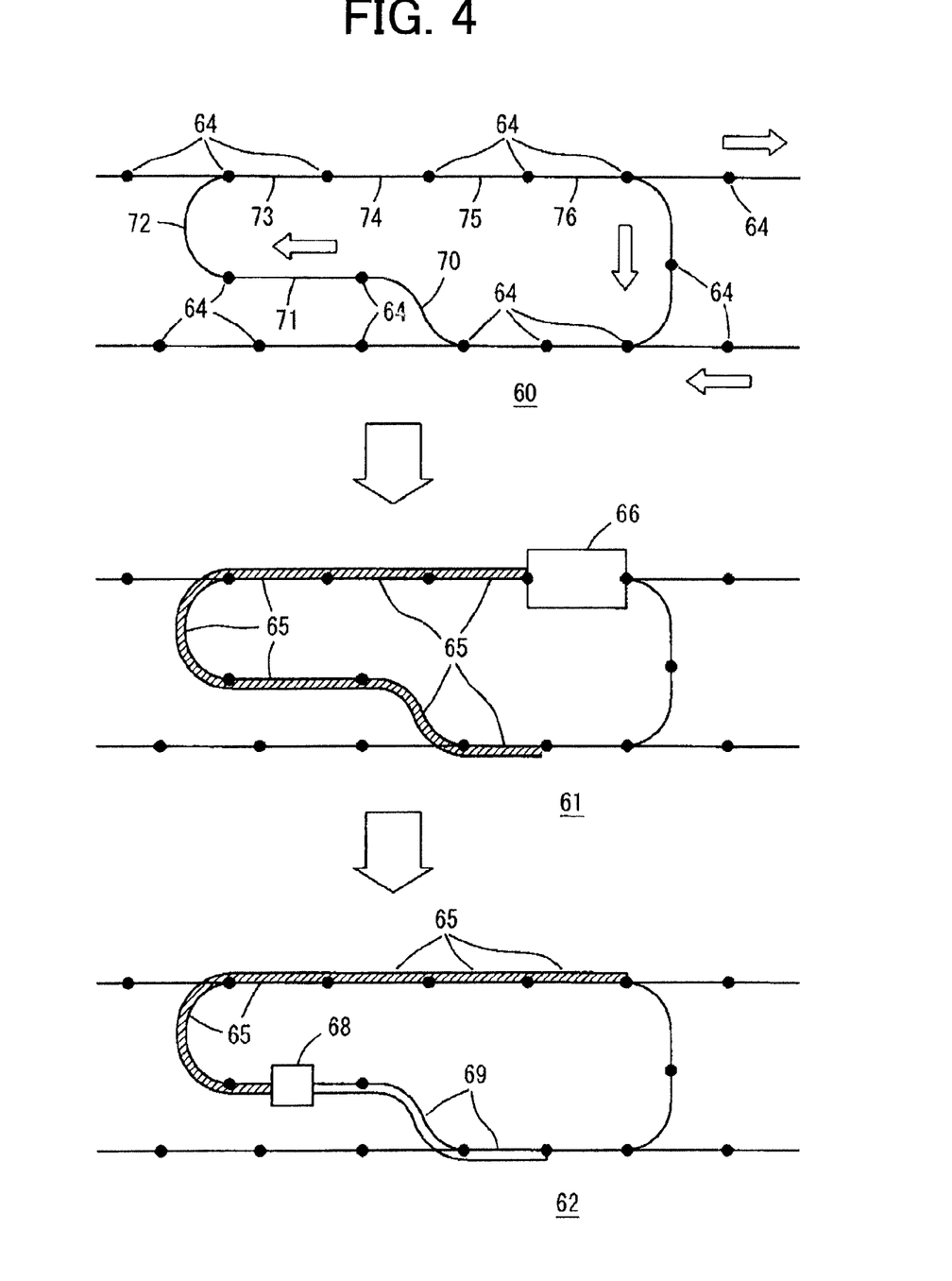
FIG. 4 schematically illustrates a method of assigning a travel path according to an embodiment of the present invention.
Figure 5:
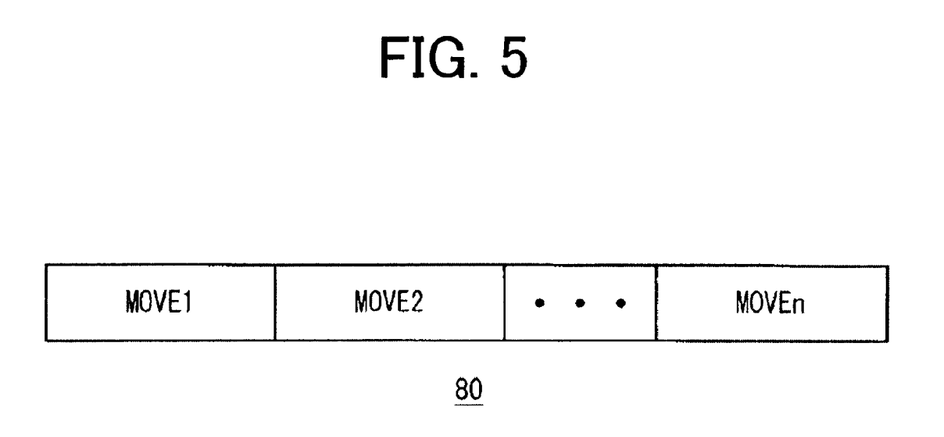
FIG. 5 illustrates an instruction given to assign a travel path according to an embodiment of the present invention.
Figure 6:
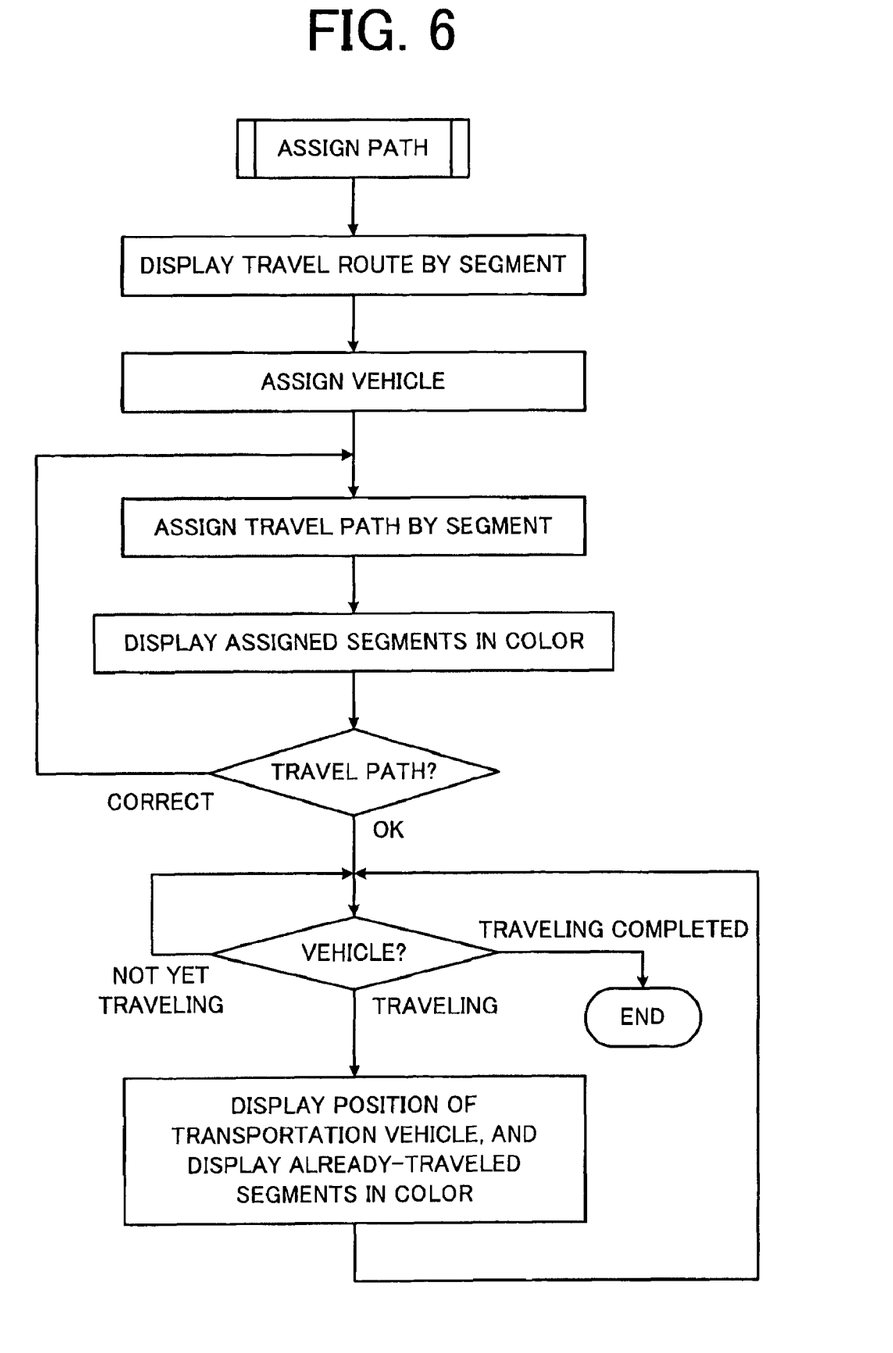
FIG. 6 is a flowchart of an algorithm of assigning a travel path according to an embodiment of the present invention.

A path assigning unit 38 generates a travel path such that the segments assigned by the operator on the color monitor 32 through the mouse 34 or the like are connected, and generates a travel instruction regarding the travel path. The travel instruction is allocated to the transportation vehicle via the communication unit 30. The path assigning operation is illustrated in FIGS. 4 through 6 in detail.

A replay unit 40 replays a past situation of the transportation vehicle system on the color monitor 32. A travel path replay unit 41 replays the path which the transportation vehicle actually traveled in response to the given transportation instruction and/or travel instruction. Replay results, such as the path which the transportation vehicle actually traveled and operations of the surrounding transportation vehicles, are displayed on the color monitor 32.

An allocation state replay unit 42 replays an allocation state of the transportation instruction on the color monitor 32 with respect to, for example, each of the intra-bay routes. For example, the number of generated transportation instructions, the number of allocated transportation instructions, and the number of unallocated transportation instructions or the like are displayed as the allocation state. The allocation state is managed with respect to each of the intra-bay routes or the like, and when a transportation instruction having a starting point inside the intra-bay route is generated, one is added to the number of transportation instructions and the number of unallocated transportation instructions with respect to the corresponding intra-bay route. When the transportation instruction is allocated, one is subtracted from the number of unallocated transportation instructions, and one is added to the number of allocated transportation instructions. Then, when execution of the allocated transportation instruction is started, and, for example, when an article assigned in the transportation instruction starts to be loaded, one is subtracted from the number of allocated transportation instructions. Instead of the start of the transportation instruction execution, one may be subtracted from the number of allocated transportation instructions at the completion of such execution. The total number of existing transportation vehicles, the number of unallocated transportation vehicles, the number of allocated transportation vehicles that have not executed the instructions, and the number of allocated transportation vehicles that are currently executing the instructions or the like are displayed with respect to each of the intra-bay routes.

A failure state replay unit 43 replays, on the color monitor 32, an area in which traffic jam has occurred in the travel route and the time of such occurrence. In the replay of the traffic jam state, the area in which such traffic jam occurred and a position of the transportation vehicle in such area are replayed. Failures, such as, for example, unavailability of a portion of the travel route and a trouble in the transportation vehicle, are replayed along with a portion and time of such failure occurrence or an ID of the transportation vehicle and the time of occurrence.

A tracking unit 50 stores a past situation of the transportation vehicle system and provides such past situation to the replaying unit 40 or the like. Reference numeral 51 denotes a searching unit, which searches for desired data. Reference numeral 52 denotes a transportation vehicle tracking file, and a file name assigns year, month, date, and time (hour) of the corresponding data. In the file 52, one record refers to a status of one transportation vehicle at certain hour, and for example, data of one hour at intervals of a second with respect to the plurality of transportation vehicles is stored in one file. Accordingly, the searching unit 51 can search for the year, month, date, and time data from the file name and also for each of the records from the ID or the number of the corresponding vehicle and from time by the minute/second, which is shorter than the hour.

A content of the transportation instruction, allocation time, and completion time are stored in a transportation instruction tracking file 53. Regarding traffic jam of the travel route, a trouble in the travel route, and a failure in the transportation vehicle, their occurrence portions, the number of the transportation vehicle in which such failure occurred, or the occurrence time and state are stored in a failure file 54.

An operation of assigning the travel path is illustrated in FIGS. 4 through 6. Accompanying such path assignment, the display on the color monitor 32 changes from a display 60 to a display 61, and a display 62 shows a state in which the transportation vehicle is currently traveling the assigned travel path. Reference numeral 80 of FIG. 5 illustrates an example of a travel instruction given to assign the travel path, and FIG. 6 represents an algorithm of assigning the travel path.

The travel route is displayed by segment on the color monitor 32, and an example thereof is illustrated in the display 60 of FIG. 4. White arrows indicate a travel direction of the transportation vehicle. Reference numeral 64 denotes segment boundaries, and each of reference numerals 70 through 76 denotes an individual segment. By clicking each of the segments through the mouse or the like, the corresponding segment is selected. As illustrated in the display 61 of FIG. 4, the already selected travel path 65 is displayed in distinction from the other segments and, more specifically, such travel path 65 is displayed in color that is different from that of the other segments. Reference numeral 66 denotes the travel path that is presently being selected. When the assignment of the travel path is completed and the transportation vehicle actually starts traveling, as illustrated in display 62 of FIG. 4, a position of the transportation vehicle is displayed in a display 68, and an already-traveled path 69 is displayed in color that is different from that of the path 65.

Accordingly, for example, by sequentially left-clicking the plurality of segments through the mouse with respect to an area ranging from a starting point to a travel destination, the travel path can be assigned. When clicking the segment, the segments 70 through 76 of FIG. 4 may be actually clicked, or the segment boundaries may be clicked. Alternatively, without requiring the clicks, the assigned segments may be selected through the mouse, a trackball, or a digitizer, or the like.

The segments 70 through 72 do not have any diverging points in midstream in FIG. 4. When the transportation vehicle passes through any of the segments 70 through 72, it passes through all of the segments 70 through 72. Accordingly, when any of the segments 70 through 72 is selected, it can be assumed that the other segments 70 through 72 are also selected at the same time. It can be also assumed that, after selecting the segment 72, for example, if the segment 76 is selected, the segments 73 through 75 arranged therebetween are also selected. As described above, it is not required to select all of the segments that form the travel path, but the segments may be selected such that the travel path can be specified, i.e., all of the segments which the transportation vehicle travels can be specified.

As illustrated in the display 61 of FIG. 4, since the already selected segments can be displayed in color that is different from that of the non-selected segments, errors in assigning the travel path can be reduced. When editing the already assigned travel path, the segment desired to be edited may be assigned by, for example, being right-clicked through the mouse, and then the selection thereof may be canceled. Further, in addition to the selection of the travel path, since the presently-being-selected travel path 66 moves, the path can be selected while the transportation vehicle is traveling. Since the display 62 shows how the transportation vehicle travels and indicates the already-traveled portion of the travel path, the travel state of the transportation vehicle can be confirmed. The display 62 may be omitted.

A travel instruction 80 of FIG. 5 is given to assign the segments of the travel path. "MOVE1" etc. of the drawing refers to an assigned segment or a plurality of segments between diverging points. The instruction 80 is transmitted to the transportation vehicle, and the transportation vehicle executes such instruction accordingly.

In the algorithm of FIG. 6, the travel route is first displayed as in the display 60, and the transportation vehicle is assigned if necessary. For example, when inspecting the travel route, a special transportation vehicle for inspection is assigned. Then, the travel path is assigned by segment, and the assigned segments are displayed in color that is different from that of the other segments. When deemed necessary, the travel path is corrected by segment. When the travel path is decided, a travel instruction is allocated to the transportation vehicle at a proper time. When the transportation vehicle is presently traveling, for example, the position of the traveling vehicle is displayed as in the display 62. For example, priority may be assigned as the timing for executing the travel instruction 80, and selection can be made from among execution performed immediately after the completion of the already allocated transportation instruction and execution performed when there is no more transportation instruction that is waiting in the queue, or the like.

The following advantages can be obtained in the present embodiment.

(1) The travel path for the transportation vehicle(s) can be easily and reliably assigned. Therefore, the travel route can be easily inspected or the like with respect to the desired travel path.

(2) By having the transportation vehicle travel the assigned travel path, required time etc. can be calculated, and then, such required time can be fed back to the route map of each of the transportation vehicles or the like and used in order to teach more efficient transportation path.

The zone controllers 14 and 15 may be omitted, and in place of such controllers 14 and 15, the transportation controller 16 may directly communicate with the transportation vehicles 8 through 10.

REFERENCE NUMERALS

2 Transportation vehicle system
4 Inter-bay route
6 Intra-bay route
8 through 10 Transportation vehicles
12 Bus
14 and 15 Zone controllers
16 Transportation controller
18 Production controller
20 Communication unit
21 Main control unit
22 Travel control unit
23 Transfer control unit
24 Lateral movement control unit
25 θ control unit
26 Route map memory
27 Route selection unit
28 Determining unit
30 Communication unit
31 Operator interface
32 Color monitor
33 Keyboard
34 Mouse
35 Allocation unit
36 Queue managing unit
38 Path assigning unit
40 Replay unit
41 Travel path replay unit
42 Allocation state Replay unit
43 Failure state replay unit
50 Tracking unit
51 Searching unit
52 Transportation vehicle tracking file
53 Transportation instruction tracking file
54 Failure file
60 through 62 Displays
64 Segment boundary
65 Already selected travel path
66 Presently-being-selected travel path
68 Display
69 Already-traveled path
70 through 76 Segments
80 Travel instruction

What is claimed is:

1. A transportation vehicle system, comprising:
a plurality of automated transportation vehicles;
a ground controller; and
a travel route for the transportation vehicles to travel, the travel route comprising at least an inter-bay route and intra-bay routes, and being formed of a plurality of interconnected segments,
wherein the transportation vehicle travels along selected segments of the travel route, and
wherein the ground controller includes
assigning means for an operator to manually assign a plurality of segments that form a path for the transportation vehicle to actually travel;
generating means for generating a travel instruction in accordance with the plurality of assigned segments; and
execution means for instructing the transportation vehicle to travel in accordance with the travel instruction,
wherein the assigning means includes a monitor for displaying the travel route of the transportation vehicles, and input means provided for the operator to manually assign the plurality of segments on the monitor, and
wherein the monitor is a color monitor, and the assigning means displays, on the color monitor, the segments assigned by the operator in a color that is different from a color of other segments.

2. The transportation vehicle system according to claim 1, wherein the travel route includes a diverging portion where one segment is connected with a plurality of segments, and a junction portion where a plurality of segments are connected with one segment, and
wherein in the input means, when two segments among a plurality of segments connected without the diverging portion are assigned, a segment(s) arranged between the two selected segments is also assigned.

3. A method for assigning a travel path to a transportation vehicle, in order to assign the travel path to the transportation vehicle in a system that includes a plurality of automated transportation vehicles, a ground controller, and a travel route for the transportation vehicles to travel, the travel route including an inter-bay route and intra-bay routes and being formed of a plurality of interconnected segments, the transportation vehicles arranged to travel along selected segments of the travel route, the method comprising the steps of:

receiving assignment of a plurality of segments that form the path for the transportation vehicles to actually travel from among the plurality of interconnected segments of the travel route of the transportation vehicles, said assignment being manually made by an operator through assigning means of the ground controller;

generating a travel instruction in accordance with the plurality of assigned segments by generating means of the ground controller; and assigning, through assigning means of the ground controller, the transportation vehicles to travel in accordance with the travel instruction, wherein in response to the receiving of the assignment of the plurality of segments by the assigning means, the assigning means displays on a color monitor the segments assigned by the operator in a color that is different from a color of other segments.

4. The method for assigning the travel path to the transportation vehicle according to claim 3, wherein the transportation vehicle is instructed to inspect a status of the travel route formed of the plurality of segments assigned in the travel instruction.

5. The method for assigning the travel path to the transportation vehicle according to claim 3, wherein each of the transportation vehicles stores a route map illustrating a layout of the travel route and travel time required for each of the segments, and wherein the travel time for each of the segments assigned in the travel instruction is acquired by the transportation vehicle, and such acquired travel time required for the corresponding segment on the route map of each of the transportation vehicles is updated.

* * * * *